(12) United States Patent
Rudmann

(10) Patent No.: US 9,875,998 B2
(45) Date of Patent: *Jan. 23, 2018

(54) FABRICATION OF OPTICS WAFER

(71) Applicant: Heptagon Micro Optics Pte. Ltd., Singapore (SG)

(72) Inventor: Hartmut Rudmann, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,746

(22) Filed: Mar. 16, 2017

(65) Prior Publication Data
US 2017/0194303 A1  Jul. 6, 2017

Related U.S. Application Data

(63) Continuation of application No. 14/420,010, filed as application No. PCT/SG2013/000354 on Aug. 19, 2013, now Pat. No. 9,634,050.

(Continued)

(51) Int. Cl.
*H01L 33/00* (2010.01)
*H01L 21/66* (2006.01)
(Continued)

(52) U.S. Cl.
CPC ...... *H01L 25/165* (2013.01); *B29D 11/00307* (2013.01); *B29D 11/00375* (2013.01);
(Continued)

(58) Field of Classification Search
CPC ......... H01L 2924/0002; H01L 2924/00; H01L 27/14685; H01L 25/167; H01L 27/14683;
(Continued)

(56) References Cited

U.S. PATENT DOCUMENTS 4,952,026 A   8/1990  Bellman et al.
8,582,022 B2  11/2013 Rudmann
(Continued)

FOREIGN PATENT DOCUMENTS

CN   1989166     6/2007
CN   101752271   6/2010
(Continued)

OTHER PUBLICATIONS

International Search Report and Written Opinion dated Dec. 5, 2013 in PCT/SG2013/000354.
(Continued)

*Primary Examiner* — Thao X Le
*Assistant Examiner* — Nduka Ojeh
(74) *Attorney, Agent, or Firm* — Fish & Richardson P.C.

(57) ABSTRACT

Fabricating an optics wafer includes providing a wafer comprising a core region composed of a glass-reinforced epoxy, the wafer further comprising a first resin layer on a top surface of the core region and a second resin layer on a bottom surface of the core region. The wafer further includes vertical transparent regions that's extend through the core region and the first and second resin layers. The wafer is thinned from its top surface and its bottom surface so that a resulting thickness is within a predetermined range without causing glass fibers of the core region to become exposed. Optical structures ate provided on one or more exposed surfaces of at least some of the transparent regions.

14 Claims, 5 Drawing Sheets

Related U.S. Application Data

(60) Provisional application No. 61/684,909, filed on Aug. 20, 2012.

(51) Int. Cl.

| | | |
|---|---|---|
| *H01L 25/16* | (2006.01) | |
| *H01L 31/0232* | (2014.01) | |
| *H01L 31/18* | (2006.01) | |
| *H01L 33/58* | (2010.01) | |
| *H01L 31/167* | (2006.01) | |
| *B29D 11/00* | (2006.01) | |

(52) U.S. Cl.
CPC ...... *H01L 25/167* (2013.01); *H01L 31/02325* (2013.01); *H01L 31/167* (2013.01); *H01L 31/1876* (2013.01); *H01L 33/58* (2013.01); *H01L 2933/0058* (2013.01)

(58) Field of Classification Search
CPC .. H01L 27/14618–27/14632; H01L 31/02325; H01L 31/18
USPC ......... 257/432, E31.127, 88, 98; 438/65, 14, 438/268, 27, 29, 401, 419, 430, 458, 459, 438/692
See application file for complete search history.

(56) References Cited

U.S. PATENT DOCUMENTS

| | | | | |
|---|---|---|---|---|
| 2002/0196405 A1* | 12/2002 | Colgan | ................ | G02F 1/1333 349/187 |
| 2002/0196563 A1 | 12/2002 | Itoh | | |
| 2005/0035474 A1 | 2/2005 | Itoh | | |
| 2005/0140861 A1* | 6/2005 | Saida | ................ | G02F 1/133305 349/112 |
| 2005/0211665 A1 | 9/2005 | Gao et al. | | |
| 2007/0128747 A1 | 6/2007 | Tamura et al. | | |
| 2008/0290435 A1* | 11/2008 | Oliver | .............. | B29D 11/00375 257/432 |
| 2009/0008127 A1* | 1/2009 | Motobe | .............. | C08G 59/3254 174/250 |
| 2009/0219603 A1* | 9/2009 | Xue | ...................... | G02B 5/285 359/288 |
| 2010/0133419 A1 | 6/2010 | Suetake | | |
| 2011/0031510 A1 | 2/2011 | Rossi et al. | | |
| 2011/0050979 A1* | 3/2011 | Rudmann | ......... | H01L 27/14623 348/335 |
| 2011/0211105 A1 | 9/2011 | Yamada et al. | | |
| 2011/0216238 A1 | 9/2011 | Fujii et al. | | |
| 2012/0075725 A1 | 3/2012 | Huddleston et al. | | |
| 2012/0081801 A1 | 4/2012 | Duparre et al. | | |
| 2013/0000968 A1* | 1/2013 | Zhao | ..................... | H05K 3/184 174/266 |
| 2013/0019461 A1 | 1/2013 | Rudmann et al. | | |
| 2013/0033767 A1 | 2/2013 | Rudmann et al. | | |

FOREIGN PATENT DOCUMENTS

| | | |
|---|---|---|
| EP | 1251365 | 2/2004 |
| EP | 2184152 | 5/2010 |
| TW | 200935881 | 8/2009 |
| WO | 2010/139342 | 12/2010 |

OTHER PUBLICATIONS

Office Action issued in Chinese Application No. 2013800515711, dated Oct. 28, 2016, 7 pages, with English Translation.

Search Report issued in Taiwan Application No. 106117581, dated Sep. 27, 2017, 1 page.

\* cited by examiner

FABRICATION OF OPTICS WAFER

CROSS-REFERENCE TO RELATED APPLICATION(S)

This application is a continuation of U.S. application Ser. No. 14/420,010, filed on Feb. 6, 2015, which is a national phase of PCT/SG2013/000354, filed on Aug. 19, 2013, which claims priority from U.S. Provisional Application No. 61/684,909, filed on Aug. 20, 2012. The entire contents of the earlier applications are incorporated herein by reference.

TECHNICAL FIELD

This disclosure relates to the fabrication of optics wafers.

BACKGROUND

Various devices incorporate optical or opto-electronic modules. Such modules are sometimes manufactured at the wafer level to facilitate the fabrication of multiple modules at the same time. Fabrication of the modules sometimes includes stacking multiple wafers one atop the other, where each wafer provides some particular functionality for the resulting modules. One or more of the wafers, which can be referred to as an optics wafer, may incorporate various optical elements. Although fabricating the modules at the wafer level can facilitate the overall manufacturing process, variations across the wafer can present challenges in such fabrication processes.

SUMMARY

The present disclosure can, in some implementations, help reduce some variations that occur in an optics wafer and can, therefore, help improve the overall wafer-level fabrication process for making optical members from the optics wafer, as well as improving the overall wafer-level fabrication process for making various optical or opto-electronic modules.

For example, in one aspect, fabricating an optics wafer includes providing a wafer comprising a core region composed of a glass-reinforced epoxy, the wafer further comprising a first resin layer on a top surface of the core region and a second resin layer on a bottom surface of the core region. The core region and first and second resin layers are substantially non-transparent for a specific range of the electromagnetic spectrum. The wafer further includes vertical transparent regions that extend through the core region and the first and second resin layers and are composed of a material that is substantially transparent for the specific range of the electromagnetic spectrum. The wafer is thinned, for example by polishing, from its top surface and its bottom surface so that a resulting thickness is within a predetermined range without causing glass fibers of the core region to become exposed. Respective optical structures are provided on one or more exposed surfaces of at least some of the transparent regions.

Some implementations include one or more of the following features. For example, the core region can be composed of a composite material composed of woven fiberglass cloth with an epoxy resin binder. The first and second resin layers can be composed, for example, of a glass-free black epoxy.

In some implementations, following the polishing, the remaining thickness of each of the first and second resin layers is in the range of 10-50% of respective initial thicknesses of the first and second resin layers. Similarly, in some implementations, following the polishing, the overall thickness of the wafer is within +5-50 μm of a predetermined thickness across the wafer. In some cases, following the polishing, variation in overall thickness of the optics wafer OW is no more than 5% with respect to absolute thickness as well as with respect to variations across the wafer.

The core region and first and second resin layers can be substantially non-transparent, for example, to the infrared or near infra-red portion of the electromagnetic spectrum. In some implementations, the optical structures on the transparent elements include lenses. The method can include using a replication process to provide the optical structures. The method also may include separating the optics wafer into individual optics members and/or incorporating the optics wafer into a wafer stack for forming opto-electronic modules.

According to a second aspect, a method of fabricating an optics wafer includes providing a precursor wafer comprising a core region composed of a glass-reinforced epoxy that is substantially non-transparent for light of a specific spectral range, the precursor wafer further comprising a first resin layer over a top surface of the core region and a second resin layer over a bottom surface of the core region. Openings are formed in the precursor wafer, such that the openings extend from a top of the precursor wafer to a bottom of the precursor wafer. The openings are substantially filled with a material that, when hardened, is substantially transparent for light of the specific spectral range, and the material in the openings is hardened to form transparent elements that are substantially transparent for light of the specific spectral range. A top surface of the precursor wafer and a bottom surface of the precursor wafer are polished to obtain a wafer having a thickness within a predetermined range without causing glass fibers of the core region to become exposed. Respective optical structures are provided on one or more exposed surfaces of at least some of the transparent elements.

In some implementations, the core region is composed of a composite material composed of woven fiberglass cloth with an epoxy resin binder that is flame resistant. Thus, the core region can be composed, for example, of a material produced by inserting continuous glass woven fabric impregnated with an epoxy resin binder, whereas the first and second resin layers can be composed, for example, of a glass-free black epoxy.

According to yet another aspect, a wafer stack includes a plurality of wafers, including an optics wafer, stacked one atop the other. The optics wafer includes a core region composed of a glass-reinforced epoxy. The optics wafer further includes a first resin layer on a top surface of the core region and a second resin layer on a bottom surface of the core region. The core region and first and second resin layers are substantially non-transparent for a specific range of the electromagnetic spectrum, and a thickness of each of the first and second resin layers is less than 10 μm. An overall combined thickness of the core region and the first and second resin layers across the optics wafer varies by no more than 5%. The optics wafer further includes transparent regions each of which extends through the core region and the first and second resin layers and is composed of a material that is substantially transparent for the specific range of the electromagnetic spectrum. The optics wafer also includes optical structures on one or more surfaces of at least some of the transparent regions.

The details of one or more implementations are set forth in the accompanying drawings and the description below.

DETAILED DESCRIPTION

Figure 1:
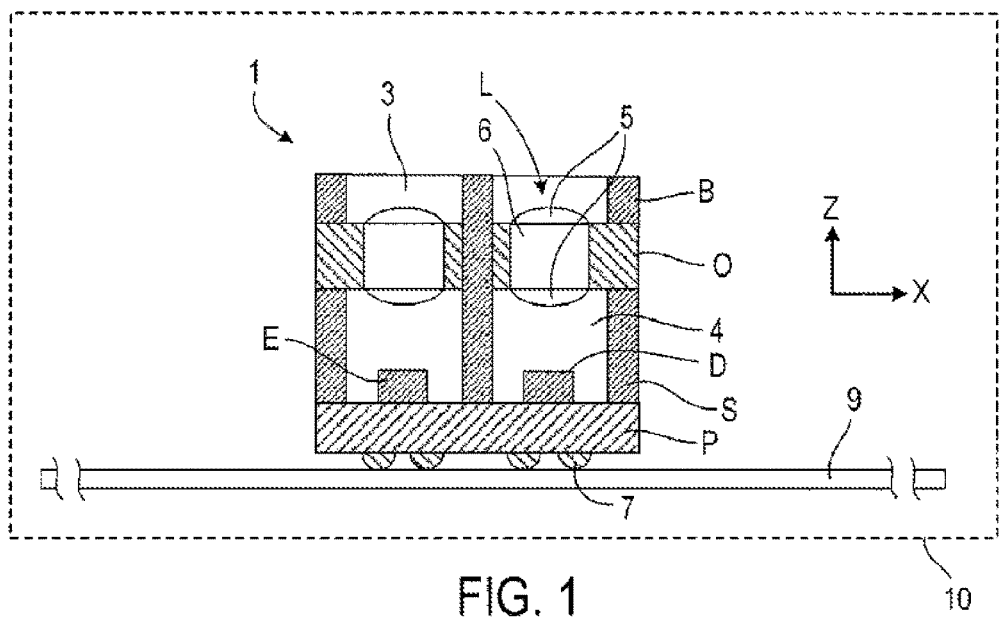
FIG. 1 is a cross-sectional view of an example of an opto-electronic module.

FIG. 1 illustrates an example of an opto-electronic module 1 mounted on a printed circuit board 9 of an electronic device 10. The electronic device 10 can be, for example, a hand-held electronic communication device such as a smart phone, or a photographic device such as a photo camera or a video camera.

The opto-electronic module 1 includes an optics member O and also at least one active optical component such as a detector D (e.g., a photo diode) and a light emitter E (e.g., a light-emitting diode). The active optical components D, E are mounted on a substrate P provided with solder balls 7. Between substrate P and optics member O, a separation member S (or spacer member S) with openings 4 is arranged to ensure a suitable distance between the active optical components D, E and the passive optical components L. On top, a baffle member B having transparent regions 3 is arranged functioning as a baffle.

The substrate P, the optics member O, the baffle member B and the separating member S can have a generally block- or plate-like shape, wherein each of the separating member S and the baffle member B has one or more holes.

Figure 2:
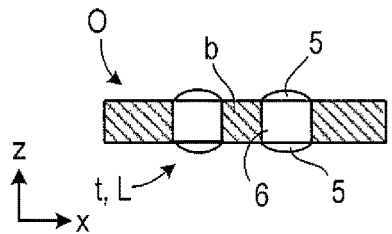
FIG. 2 is a cross-sectional view of an example of an optics member.
Figure 3:
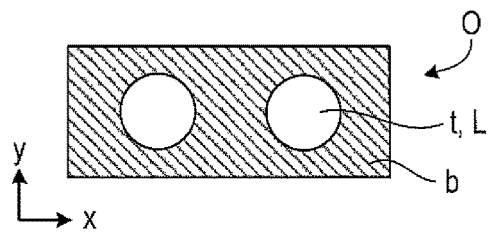
FIG. 3 is a top view of the optics member of FIG. 2.

As illustrated in FIGS. 2 and 3, the optical member O includes a blocking portion b and two transparent portions t. Blocking portion b is made of a material (e.g., a polymer material such as a glass-reinforced epoxy) that is substantially non-transparent for light of a specific spectral range (wavelength or wavelength range), whereas the transparent portions t are made of a material which is substantially transparent for light at least of the specific spectral range. This way, blocking portion b functions as an aperture for each of the transparent portions t and also fixes (or holds) the transparent portions t. Blocking portion b also can function as a shield for protection from undesired light, by substantially attenuating or blocking light of the specific spectral range.

In the illustrated example, each of the transparent portions t has multiple parts: two optical structures 5 (e.g., concave or convex lens elements) and a transparent element 6. Together, these form a lens member L which is a passive optical component. Blocking portion b together with transparent elements 6 describes a substantially solid plate-like shape with the optical structures 5 protruding from the surface. Each of the transparent elements 6 has two opposing lateral surfaces which are substantially flat.

There exist one or more specific wavelength ranges for which the passive optical components L (and thus the transparent material T and the material for the optical structures 5 (which may be the same as or different from material T)) are transparent, but for which the material for the blocking portion b is non-transparent.

In some implementations, there is an overlapping wavelength range of the wavelength range of light emittable by light emitter E and the wavelength range of light detectable by the light detector D. At least in that overlapping wavelength range, blocking portion b will be non-transparent, and at least in a portion of the overlapping wavelength range, transparent portion t will be transparent. In some implementations, the overlapping wavelength range is in the infrared portion, and may be in the near-infrared portion, of the electromagnetic spectrum. This can be particularly useful for situations in which the module 1 serves as a proximity sensor.

Figure 4:
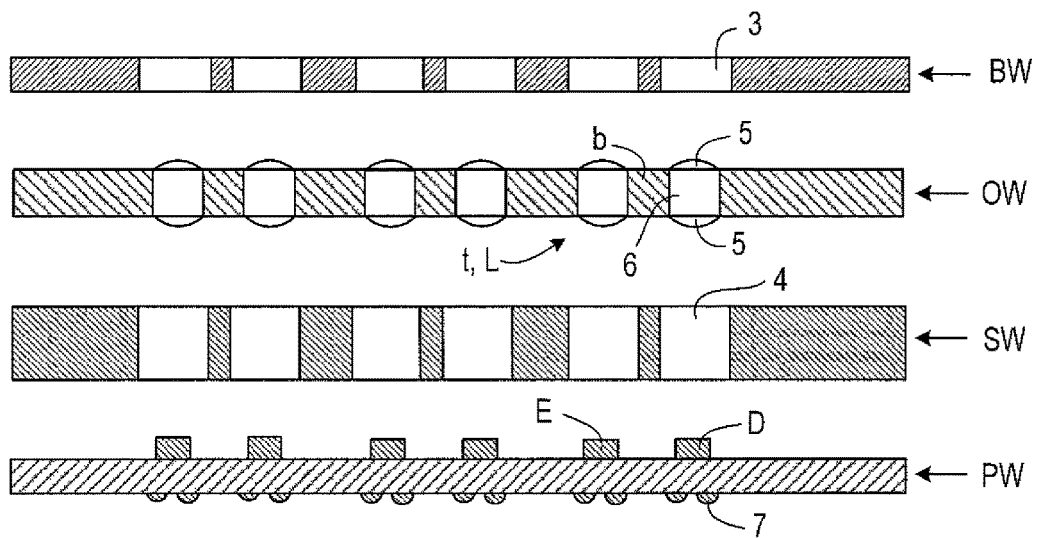
FIG. 4 is a cross-sectional view of wafers for forming a wafer stack that includes an optics wafer.

The opto-electronic module 1 can be manufactured on a wafer-scale. FIG. 4, for example, illustrates a schematic cross-sectional view of wafers for forming a wafer stack 2 (cf. FIG. 5) for manufacturing multiple modules 1.

Figure 5:
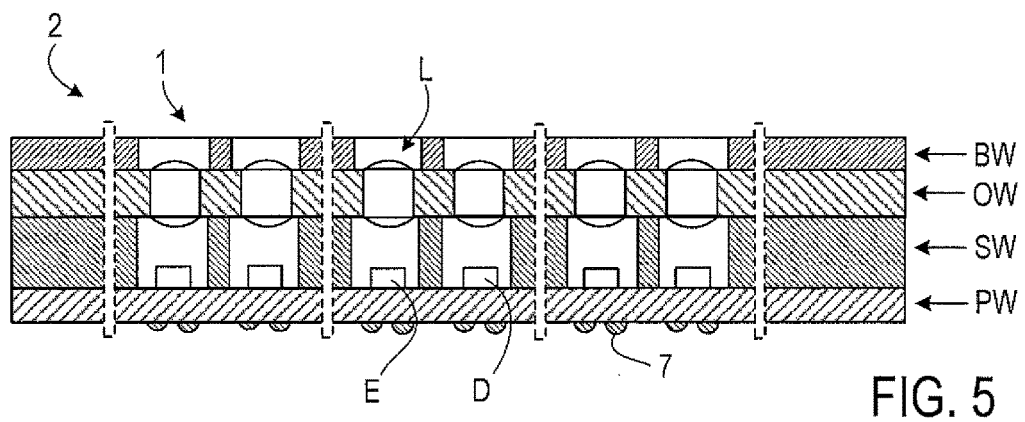
FIG. 5 is a cross-sectional view of a wafer stack, including an optics wafer.

As shown in FIGS. 4 and 5, in some implementations, four wafers are used to manufacture multiple modules 1: a substrate wafer PW, a spacer wafer SW, an optics wafer OW and a baffle wafer BW. Each wafer includes multiple corresponding members arranged, for example, on a rectangular lattice, e.g., with a little distance from each other for a wafer separation step.

Substrate wafer PW can be, for example, a printed circuit board (PCB) of standard PCB materials, provided with solder balls 7 on the one side and with active optical components (E and D) soldered to the other side. The latter can be placed on substrate wafer PW by pick-and-place using standard pick-and-place machines.

To form the wafer stack 2, the wafers BW, OW, SW, PW are aligned and glued together, e.g., using a heat-curable epoxy resin. The aligning comprises aligning the substrate wafer PW and the optics wafer OW such that each of the detecting members D is aligned with respect to at least one of the transparent portions t, in particular wherein each of the detecting members D is aligned in the same way to one of the transparent portions t each, and the same applies to the light emitters E. The thin dashed rectangles in FIG. 5 indicate where separation takes place, e.g., by means of a dicing saw.

Although the foregoing figures show provisions for only three modules 1, there can be, in one wafer stack, provisions for as many as ten or more modules 1 in each lateral direction.

In order to provide maximum protection from detecting undesired light, each of the wafers PW, SW, OW, BW can be made substantially of a material substantially non-transparent for light detectable by detecting members D (other than transparent portions t and transparent regions 3). In some implementations, each of the wafers PW, SW, OW, BW is formed of a printed circuit board (PCB) material, which may, in some cases, be fiber-reinforced. Thus, for example, the non-transparent portions of the optics wafer OW can be made of a PCB material such as FR4 (also known as Garolite) or G10 (also known as Micarta). FR4 s a grade designation assigned to glass-reinforced epoxy printed circuit boards. It is a composite material composed of woven fiberglass cloth with an epoxy resin binder that is flame resistant. G10 is similar to FR4, but lacks the self-extinguishing flammability characteristics. The non-transparent portions of the optics wafer OW can be made of other similar PCB materials, including materials that are produced by inserting continuous glass woven fabric impregnated with an epoxy resin binder while forming the sheet under high pressure.

Some applications that incorporate an optics wafer OW demand tight thickness control of the optics wafer. As an example, the nominal thickness of the optics wafer OW for some applications may be approximately 395 microns ($\mu m$) with a tolerance of +5 $\mu m$. Other applications also may require tight thickness control, although with different thicknesses and/or tolerances.

Unfortunately, simply polishing a standard PCB wafer to achieve the desired thickness control may result in fibers of the woven glass PCB material becoming exposed at the surface of the wafer. To overcome this problem, an additional layer of resin, such as a black epoxy material, can be added to the top and bottom surfaces of a standard PCB wafer. The top and bottom resin layers should be composed substantially of pure resin material (i.e., they should not be glass-reinforced). Also, the top and bottom resin layers should be sufficiently thick so that the surfaces subsequently can be polished to achieve the desired thickness control without exposing the fibers at the top and bottom surfaces of the composite resin/glass wafer.

Figure 6:
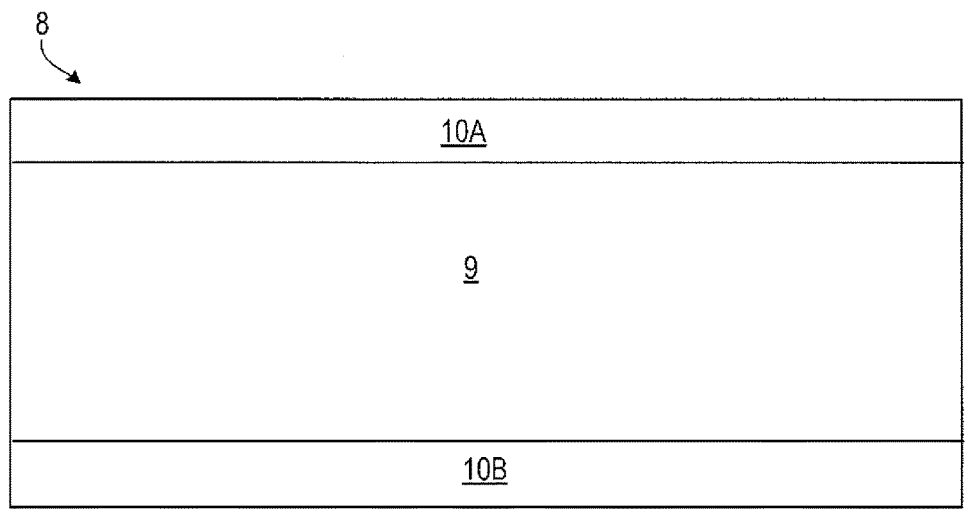
FIG. 6 is a cross-sectional view illustrating an example of a precursor wafer used to obtain the optics wafer.
Figure 13:
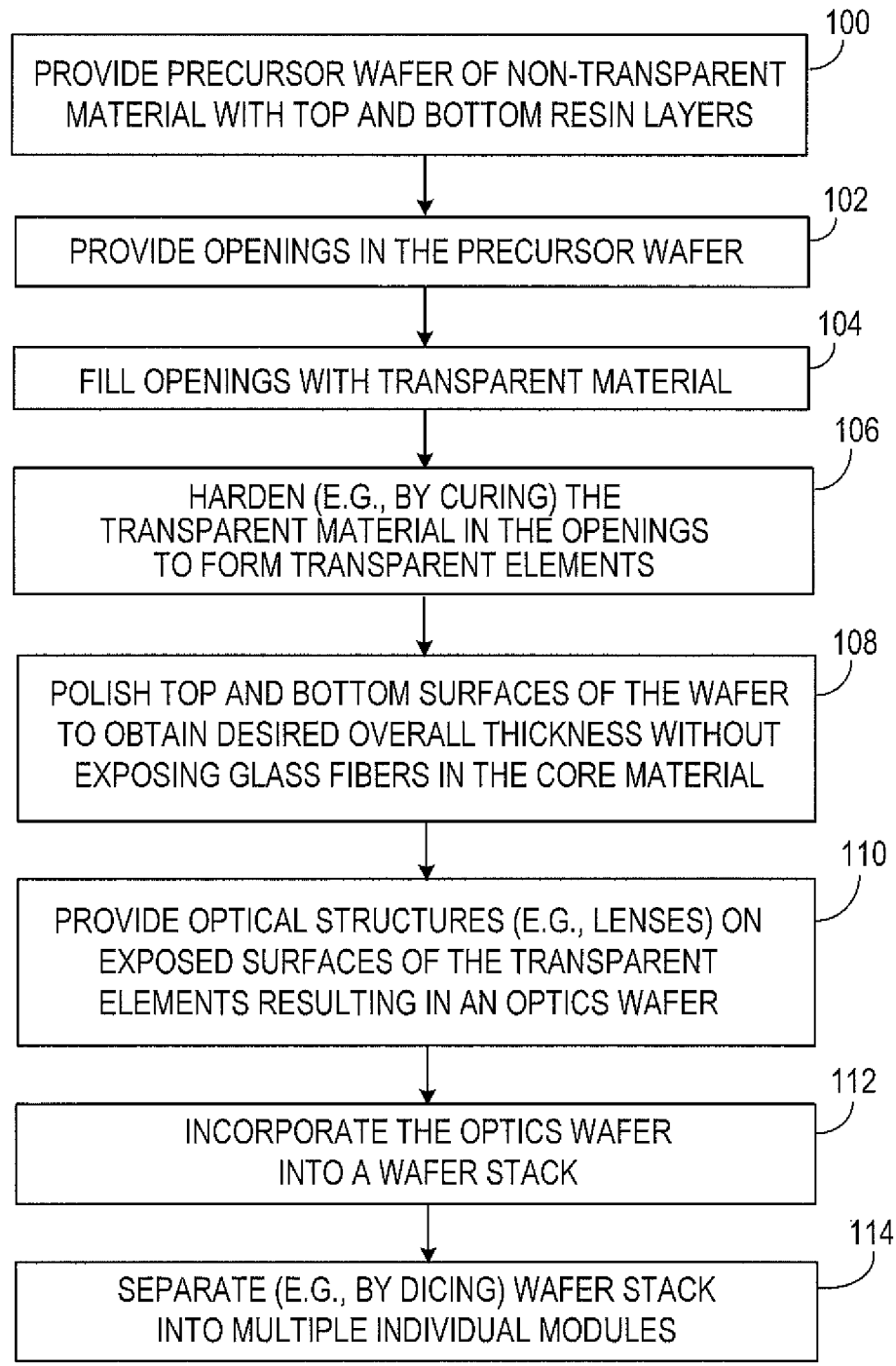
FIG. 13 is a flow chart of a method of forming an optics wafer.

For example, in some applications it is desirable to start with a resin/glass composite precursor wafer 8 having at least twenty $\mu m$ of glass-free black epoxy material on each of the top and bottom surfaces (see FIG. 13, block 100). Using a black epoxy for the top and bottom resin layers allows those layers also to be substantially non-transparent to the specified part of the electromagnetic spectrum (e.g., to radiation in the infra-red or near infra-red part of the spectrum). Other non-transparent resin materials may be used as well. In a particular example illustrated in FIG. 6, a composite precursor wafer 8 has a core 9 of glass-reinforced epoxy having a thickness of about 380 $\mu m$, and top and bottom resin layers 10A, 10B, each having a thickness of about 20 $\mu m$. The thicknesses may vary in other implementations.

Figure 7:
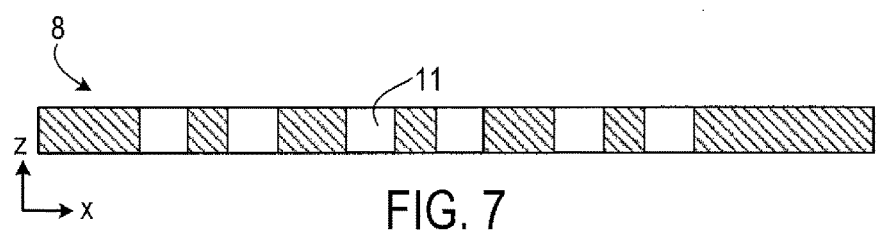
FIGS. 7-11 illustrate various processing steps in forming the optics wafer according to some implementations.

FIG. 7 illustrates schematically a precursor wafer 8 made of non-transparent material as described above and having multiple openings (e.g., through-holes) 11 that extend from the wafer's top surface to its bottom surface. One or more of the openings 11 can be arranged, for example, on a rectangular lattice. As optics member O (FIGS. 1 and 2), which is to be fabricated, comprises two transparent portions t, the openings 11 are arranged on a rectangular lattice. The openings 11 can be formed, for example, by drilling or etching (block 102, FIG. 13). The shape of the openings 11 can be different from the illustrated cylindrical shape.

Figure 8:
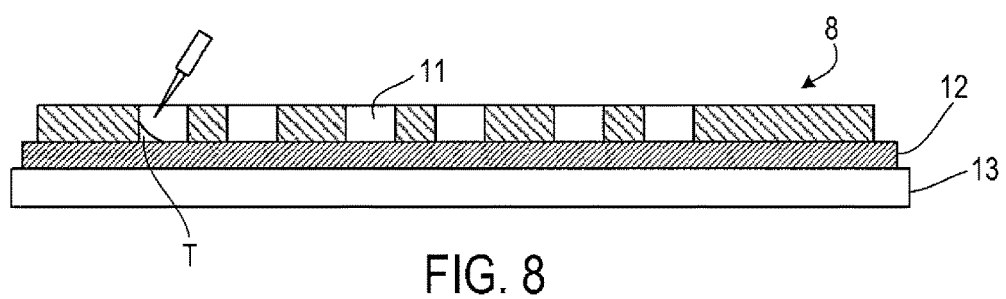

Next, as shown in FIG. 8, the openings 11 are filled with a transparent material T for the transparent elements 6 (block 104, FIG. 13). During the filling, the transparent material T, for example, a polymer, is liquid or viscous. A squeegee process similar to what is known from screen printing can be used, or a dispenser, e.g., such as known from the semiconductor industry and used for underfilling, can be used. The dispensing can be carried out one-by-one, or several openings can be filled simultaneously, e.g., by using several hollow needles outputting transparent material T. During the filling, the precursor wafer 8 can lie on a support layer 12, e.g., made of a silicone such as polydimethylsiloxane. Support layer 12 is supported by a rigid support substrate 13, e.g., a glass plate, for mechanical stability.

During filling-in the transparent material T, care should be taken to prevent the formation of air bubbles or cavities in the material T, because this may degrade the optical properties of the passive optical components L to be produced. For example, the dispensing can be carried out in such a way that wetting of the wafer material starts at an edge formed by the precursor wafer 8 and the underlying support layer 12 or in a place close to such an edge, e.g., by suitably guiding a hollow needle outputting the material T close to such an edge. The filling-in is stopped when the openings 11 are substantially filled with the material T. The filled-in transparent material T then is hardened, for example, by curing, e.g., using heat or UV radiation, which results in transparent regions 6 (block 106, FIG. 13). In some implementations, the so-obtained transparent regions 6 have two nearly perfectly planar lateral surfaces that form a common planar surface with the surrounding non-transparent, blocking portion b of the precursor wafer 8. However, in other implementations, the filling may be less planar (e.g., a slightly concave or convex surface may be formed).

Figure 9:
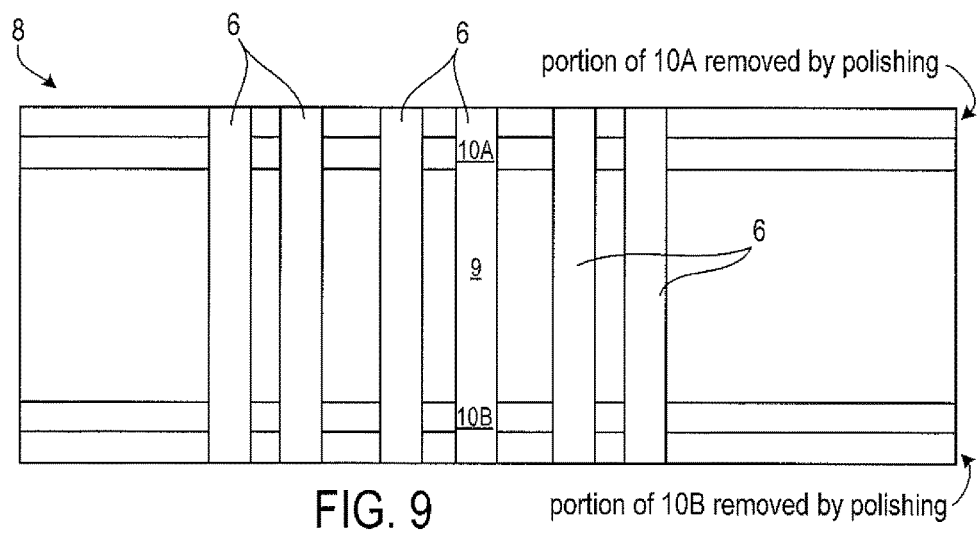

Next, the top and bottom surfaces of the composite wafer 8 are polished to remove material from each surface to obtain the desired overall thickness for the wafer (see FIG. 9 and FIG. 13, block 108). Thus, using the example above, in which the composite precursor wafer 8 has a core 9 of glass-reinforced epoxy with a thickness of about 380 $\mu m$, and each of the top and bottom resin layers 10A, 10B have a thickness of about 20 $\mu m$, the polishing is performed so as to remove approximately 10-15 $\mu m$ of material from each of the top and bottom surfaces to obtain an overall thickness for the resulting wafer of about 395 $\mu m$+5 $\mu m$. Although the polishing may result in removal of a significant amount of the top and bottom resin layers 10A, 10B, the polishing should be stopped before the entire top and bottom resin layers 10A, 10B are removed. Thus, although in the foregoing example about 50%-75% of the top and bottom resin layers 10A, 10B is removed by the polishing, several microns (e.g., 2-5 $\mu m$) of each of the top and bottom resin layer should remain even after polishing is complete. In some applications, about 10-50% of the initial resin layer thickness remains following the polishing.

The polishing can result in a wafer with tight thickness control (e.g., with respect to the absolute thickness as well as with respect to variations across the wafer). For example, depending on the application, the overall thickness of the optics wafer OW can range, for example, from 100-1000 $\mu m$ with a tolerance of ±5-50 $\mu m$. Some applications can achieve a variation in overall thickness of the optics wafer OW of 0.5-5% (no more than 5%) with respect to the absolute thickness as well as with respect to variations across the wafer. Furthermore, as thin resin layers remain over the top and bottom surfaces of the core material 9, the desired thickness control can be achieved without exposing the glass fibers in the core material 9. In addition, the polishing can result in more perfectly planar lateral surfaces for the transparent elements 6.

Figure 10:
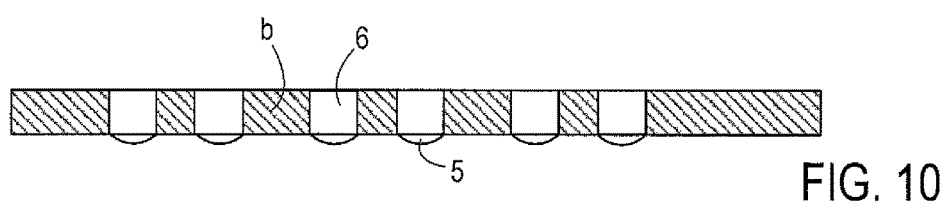
Figure 11:
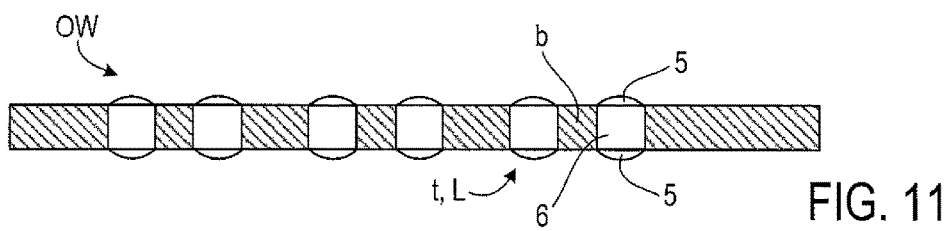

After the polishing is performed, optical structures (e.g., lenses) 5 are applied to the exposed surfaces of the transparent elements 6 (cf. FIGS. 10, 11 and FIG. 13, block 110). This can be accomplished, e.g., by replication, in which a structured surface is embossed into a liquid, viscous or plastically deformable material. The material then is hardened, e.g., by curing using ultraviolet radiation or heating, and the structured surface is removed. Thus, a replica (which in this case is a negative replica) of the structured surface is obtained. Suitable materials for replication include, e.g., hardenable or curable polymer materials or other replication materials, i.e., materials which are transformable by hardening or curing from a liquid, viscous or plastically deformable state into a solid state.

In some implementations, the replication process takes place using a form having a structured surface describing a negative of the optical structures 5 to be produced. A suitable amount of a replication material is provided in the form, and then the form with the structured surface is moved towards the wafer so as to bring the replication material in contact with a transparent element 6. Subsequently, the replication material is hardened, e.g., cured, for example by heating or irradiating with light (such as UV light), and the form is removed. Formation of the optical structures 5 (by replication or another process) may be accomplished one-by-one or several at a time (but only a fraction of all on one side the wafer), or simultaneously for all on one side of the wafer.

The optical structures 5 can be formed on one or on both sides of the wafer (cf. FIGS. 10 and 11). The lateral extension of the optical structures 5 can be larger or smaller than the lateral extension of the transparent elements 6, or substantially identical as shown in FIGS. 10 and 11. The optical structures 5 can be lens elements of virtually any shape, be it refractive and/or diffractive lens elements, or prism elements or others. For some applications, lens elements are a suitable choice. As explained above, the fabrication process can result in an optics wafer OW (FIG. 11) having tight thickness control with respect to the absolute thickness as well as with respect to variations across the wafer.

The resulting optics wafer OW (FIG. 11) can be used for producing further products. For example, the optics wafer OW can be incorporated into a wafer stack 2 (FIG. 13, block 112), which then is separated (e.g., by dicing) into multiple individual opto-electronic modules 1 (see FIGS. 4, 5 and 13, block 114), each of which includes an optics member O (see FIGS. 1-3). The optics wafer OW can be incorporated into other types of wafer stacks, which may include different types or a different number of wafers.

Figure 12:
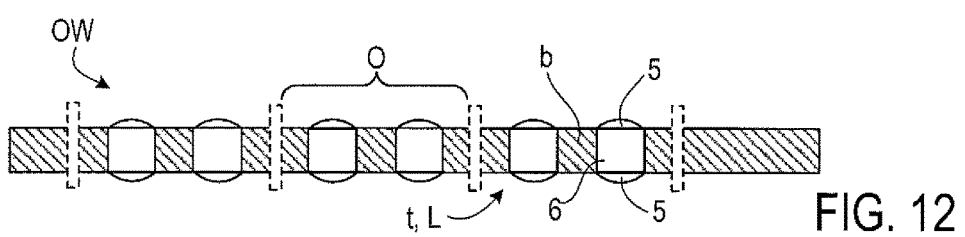
FIG. 12 illustrates separating an optics wafer into multiple optics members.

Also, in some applications, the optics wafer OW itself can be separated (e.g., by dicing; see FIG. 12) into multiple optics members O like those shown in FIGS. 2 and 3 even if the optics wafer is not incorporated into a wafer stack. In FIG. 12, the thin dashed rectangles indicate where separation can take place.

The foregoing fabrication techniques can be part of an automated manufacturing process.

Other implementations are within the scope of the claims.

What is claimed is:

1. A method of fabricating an optics wafer, the method comprising:
    providing a precursor wafer comprising a core region composed of a glass-reinforced epoxy that is substantially non-transparent for light of a specific spectral range, the precursor wafer further comprising a first resin layer over a top surface of the core region and a second resin layer over a bottom surface of the core region, wherein the first and second resin layers are substantially non-transparent for light of the specific spectral range;
    forming openings in the precursor wafer, the openings extending from a top of the precursor wafer to a bottom of the precursor wafer;
    substantially filling the openings with a material that, when hardened, is substantially transparent for light of the specific spectral range;
    hardening the material in the openings to form transparent elements that are substantially transparent for light of the specific spectral range;
    subsequently polishing a top surface of the precursor wafer and a bottom surface of the precursor wafer to obtain a wafer having a thickness within a predetermined range without causing glass fibers of the core region to become exposed; and
    subsequently providing respective optical structures on one or more exposed surfaces of at least some of the transparent elements.

2. The method of claim 1 wherein the core region is composed of a composite material composed of woven fiberglass cloth with an epoxy resin binder that is flame resistant.

3. The method according to claim 1 wherein the core region is composed of a composite material composed of woven fiberglass cloth with an epoxy resin binder.

4. The method according to claim 1 wherein the core region is composed of a material produced by inserting continuous glass woven fabric impregnated with an epoxy resin binder.

5. The method according to claim 1 wherein the first and second resin layers are not glass-reinforced.

6. The method according to claim 1 wherein the first and second resin layers are composed of a glass-free black epoxy.

7. The method according to claim 1 wherein, following the polishing, an overall thickness of the wafer is within +5-50 µm of a predetermined thickness across the wafer.

8. The method according to claim 1 wherein, following the polishing, variations in overall thickness of the wafer are no more than 5% across the wafer.

9. The method of claim 1 wherein the specific spectral range includes the infrared portion of the electromagnetic spectrum.

10. The method of claim 1 wherein the specific spectral range includes the near-infrared portion of the electromagnetic spectrum.

11. The method according to claim 1 wherein, following the polishing, a remaining thickness of each of the first and second resin layers is in the range of 10-50% of respective initial thicknesses of the first and second resin layers.

12. The method according to claim 1 wherein the optical structures on the transparent elements include lenses.

13. The method according to claim 1 including using a replication process to provide the optical structures.

14. The method according to claim 1 wherein the optical structures are formed on exposed surfaces of the transparent elements at opposite sides of the wafer.

* * * * *